(12) United States Patent
Yasuda

(10) Patent No.: US 9,419,585 B2
(45) Date of Patent: Aug. 16, 2016

(54) ELASTIC WAVE FILTER DEVICE AND DUPLEXER

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 64 days.

(21) Appl. No.: 14/445,307

(22) Filed: Jul. 29, 2014

(65) Prior Publication Data

US 2015/0054597 A1 Feb. 26, 2015

(30) Foreign Application Priority Data

Aug. 22, 2013 (JP) ................... 2013-172312

(51) Int. Cl.
*H03H 9/72* (2006.01)
*H03H 9/64* (2006.01)
*H03H 9/54* (2006.01)
*H03H 9/56* (2006.01)

(52) U.S. Cl.
CPC ............... *H03H 9/725* (2013.01); *H03H 9/542* (2013.01); *H03H 9/6423* (2013.01); *H03H 9/562* (2013.01)

(58) Field of Classification Search
CPC ....... H03H 9/725; H03H 9/542; H03H 9/562; H03H 9/6423
USPC ........................................ 333/133, 193–196
See application file for complete search history.

(56) References Cited

U.S. PATENT DOCUMENTS

| | | | | |
|---|---|---|---|---|
| 5,933,062 A | * | 8/1999 | Kommrusch | H03H 9/6483 310/313 B |
| 2003/0006859 A1 | * | 1/2003 | Taniguchi | H03H 9/725 333/133 |
| 2004/0140866 A1 | | 7/2004 | Taniguchi | |
| 2006/0091977 A1 | * | 5/2006 | Inoue | H03H 9/0576 333/133 |
| 2007/0296528 A1 | * | 12/2007 | Kando | H03H 9/0071 333/195 |
| 2012/0313726 A1 | | 12/2012 | Ueda et al. | |

FOREIGN PATENT DOCUMENTS

| | | |
|---|---|---|
| JP | 2004-242281 A | 8/2004 |
| JP | 2011-176746 A | 9/2011 |

* cited by examiner

*Primary Examiner* — Benny Lee
*Assistant Examiner* — Jorge Salazar, Jr.
(74) *Attorney, Agent, or Firm* — Keating & Bennett, LLP

(57) ABSTRACT

An elastic wave filter device includes a one-port elastic wave resonator and an elastic wave filter unit connected in series to the one-port elastic wave resonator. The one-port elastic wave resonator is connected in parallel to an inductance. In the elastic wave filter device, fr1>f0 is satisfied, where f0 is the center frequency of a passband of the elastic wave filter unit, and fr1 is a resonant frequency of the one-port elastic wave resonator.

16 Claims, 14 Drawing Sheets

ELASTIC WAVE FILTER DEVICE AND DUPLEXER

BACKGROUND OF THE INVENTION

1. Field of the Invention

The present invention relates to elastic wave filter devices preferably for use as bandpass filters and duplexers including elastic wave filter devices, and in particular, duplexers and elastic wave filter devices, each configured with a plurality of elastic wave resonators.

2. Description of the Related Art

Hitherto, elastic wave filters are widely used as bandpass filters for use in cellular phones and the like. For example, Japanese Unexamined Patent Application Publication No. 2004-242281 discloses a ladder filter including a plurality of surface acoustic wave resonators, and describes that the ladder filter is provided with a first series arm resonator to which an inductance is connected in parallel and a second series arm resonator to which no inductance is connected. Here, it is assumed that fsr1<fsr2 is satisfied, where fsr1 is a resonant frequency of the first series arm resonator, and fsr2 is a resonant frequency of the second series arm resonator.

Further, Japanese Unexamined Patent Application Publication No. 2011-176746 describes an elastic wave filter in which a series arm resonator to which an inductance is connected in parallel has a lower resonant frequency than a series arm resonator to which no inductance is connected.

As described in Japanese Unexamined Patent Application Publication Nos. 2004-242281 and 2011-176746, the series arm resonator to which an inductance is connected in parallel has a lower resonant frequency than the series arm resonator to which no inductance is connected.

However, there is an issue that loss in a passband increases when Q value of the foregoing inductance decreases. On the other hand, when an inductance having a higher Q value is used, there is another issue that fabrication steps become more complicated and lead to higher cost.

SUMMARY OF THE INVENTION

Preferred embodiments of the present invention provide an elastic wave filter device that significantly reduces or prevents degradation of loss in a passband thereof and a duplexer that includes such an elastic wave filter device.

An elastic wave filter device according to a preferred embodiment of the present invention includes a piezoelectric substrate, an elastic wave filter unit, a one-port elastic wave resonator, and an inductance. The elastic wave filter unit includes at least one interdigital transducer (IDT) located on the piezoelectric substrate. The one-port elastic wave resonator includes an IDT connected in series to the elastic wave filter unit.

The inductance is connected in parallel to the one-port elastic wave resonator. In a preferred embodiment of the present invention, a resonant frequency fr1 of the one-port elastic wave resonator is on a higher frequency side of a passband of the elastic wave filter unit than a center frequency f0, where f0 is the center frequency of the passband of the elastic wave filter unit.

In one aspect of the elastic wave filter device according to a preferred embodiment of the present, a wavelength determined by an electrode finger pitch of the IDT in the one-port elastic wave resonator preferably is shorter than the shortest one of the wavelengths determined by electrode finger pitches of the IDTs in the elastic wave filter unit. This improves design flexibility.

In another aspect of the elastic wave filter device according to a preferred embodiment of the present invention, the wavelength determined by the electrode finger pitch of the IDT in the one-port elastic wave resonator preferably is shorter than the wavelengths determined by the electrode finger pitches in the elastic wave filter unit. This improves design flexibility.

In still another aspect of the elastic wave filter device according to a preferred embodiment of the present invention, the inductance preferably is disposed on the piezoelectric substrate. Thus, downsizing is achieved.

In another aspect of the elastic wave filter device according to a preferred embodiment of the present invention, the elastic wave filter unit preferably is a ladder elastic wave filter unit including the piezoelectric substrate, a series arm disposed on the piezoelectric substrate, a parallel arm connected between the series arm and ground potential, a plurality of series arm resonators disposed on the series arm, and a parallel arm resonator disposed on the parallel arm, wherein the plurality of series arm resonators and the parallel arm resonator each include an elastic wave resonator including an IDT. In this case, no inductance is connected in parallel to the plurality of series arm resonators. Further, the resonant frequency fr1 of the one-port elastic wave resonator preferably is on a higher frequency side than a resonant frequency fr2, where fr2 is the highest of resonant frequencies of the series arm resonators of the ladder elastic wave filter unit.

In another aspect of the elastic wave filter device according to a preferred embodiment of the present invention, the wavelength determined by the electrode finger pitch of the IDT in the one-port elastic wave resonator preferably is shorter than a wavelength determined by an electrode finger pitch of the series arm resonator.

More preferably, the wavelength of the one-port elastic wave resonator is shorter than the shortest one of wavelengths determined by electrode finger pitches in the plurality of series arm resonators.

In another aspect of the elastic wave filter device according to a preferred embodiment of the present invention, the resonant frequency fr1 of the one-port elastic wave resonator preferably is higher than a resonant frequency of the series arm resonator that has a lowest resonant frequency among the plurality of series arm resonators.

In another aspect of the elastic wave filter device according to a preferred embodiment of the present invention, the resonant frequency fr1 of the one-port elastic wave resonator preferably is higher than resonant frequencies of the plurality of series arm resonators.

In another aspect of the elastic wave filter device according to a preferred embodiment of the present invention, a Q value of the inductance preferably is equal to or less than 20, for example.

In another aspect of the elastic wave filter device according to a preferred embodiment of the present invention, the elastic wave filter unit preferably is a filter unit that includes the piezoelectric substrate and a longitudinally coupled resonator-type elastic wave filter disposed on the piezoelectric substrate.

A duplexer according to another preferred embodiment of the present invention includes a first bandpass filter including the elastic wave filter device according to a preferred embodiment of the present invention, and a second bandpass filter that has a different passband from the first bandpass filter.

The elastic wave filter according to various preferred embodiments of the present invention significantly reduces or prevents insertion loss in the passband even when the inductance has a lower Q value. Thus, the elastic wave filter device with less loss is provided. Further, according to another preferred embodiment of the present invention, the duplexer with less loss is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is disclosed by describing specific preferred embodiments thereof with reference to the drawings.

Figure 1:
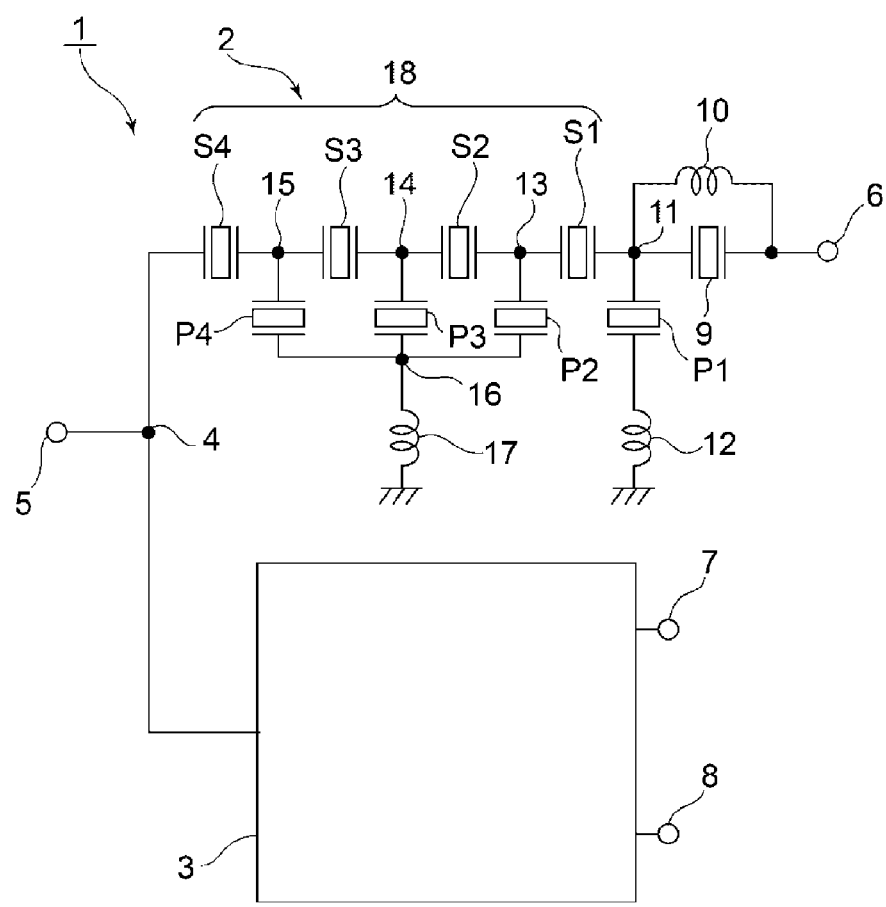
FIG. 1 is a circuit diagram of a duplexer according to a first preferred embodiment of the present invention.

FIG. 1 is a circuit diagram of a duplexer according to a first preferred embodiment of the present invention. A duplexer 1 includes a transmission filter 2 that defines and serves as a first bandpass filter and a reception filter 3 that defines and serves as a second bandpass filter. The duplexer 1 of the present preferred embodiment preferably is for use in, but not necessarily limited to, a W-CDMA Band 1 communication system, for example. Thus, a passband of the transmission filter 2 preferably is approximately from 1920 MHz to 1980 MHz, and a center frequency f0 is about 1950 MHz, for example. A passband of the reception filter 3 preferably is approximately from 2110 MHz to 2170 MHz, for example. In other words, the passband of the reception filter 3 is different from that of the transmission filter 2, regardless of the specific frequency values thereof.

End portions of the transmission filter 2 and the reception filter 3 are connected to an antenna terminal 5 through a common connection terminal 4. The transmission filter is connected to a transmission terminal 6 at the other end portion. The reception filter 3 is connected to a pair of balanced reception terminals 7 and 8 at the other end portions.

The transmission filter 2 corresponds to an elastic wave filter device according to a preferred embodiment of the present invention. The transmission filter 2 includes an elastic wave filter unit 18 that has a ladder circuit configuration and a one-port elastic wave resonator 9. In other words, the transmission terminal 6 is connected to the one-port elastic wave resonator 9. The transmission terminal 6 is connected to, via this one-port elastic wave resonator 9, the elastic wave filter unit 18 of a ladder type. The elastic wave filter unit 18 includes a plurality of series arm resonators S1 to S4 and a plurality of parallel arm resonators P1 to P4. Specifically, on a series arm that connects the common connection terminal 4 and a connection point 11 between the one-port elastic wave resonator 9 and the elastic wave filter unit 18, the series arm resonators S1 to S4 are sequentially arranged from the transmission terminal 6 side.

An inductance 10 is connected in parallel to the one-port elastic wave resonator 9. No inductance is connected in parallel to the series arm resonators S1 to S4.

Further, the parallel arm resonator P1 is connected to a parallel arm that connects the connection point 11 and ground potential. An inductance 12 is connected between the parallel arm resonator P1 and the ground potential.

The parallel arm resonators P2, P3, and P4 are connected between the ground potential and a connection point 13 between the series arm resonators S1 and S2, a connection point 14 between the series arm resonators S2 and S3, and a connection point 15 between the series arm resonators S3 and S4, respectively. Ground potential side end portions of the parallel arm resonators P2 to P4 are connected together at a common connection point 16. An inductance 17 is connected between the common connection point 16 and the ground potential.

In the present preferred embodiment, the transmission filter 2 includes the one-port elastic wave resonator 9 and the elastic wave filter unit 18 including a ladder filter. Further, a resonant frequency fr1 of the one-port elastic wave resonator 9 to which the inductance 10 is connected in parallel is on a higher frequency side of the passband of the elastic wave filter unit 18 than the center frequency f0. This reduces or prevents insertion loss in the passband, namely, the transmission band even when the Q value of the inductance 10 is lowered.

Figure 2:
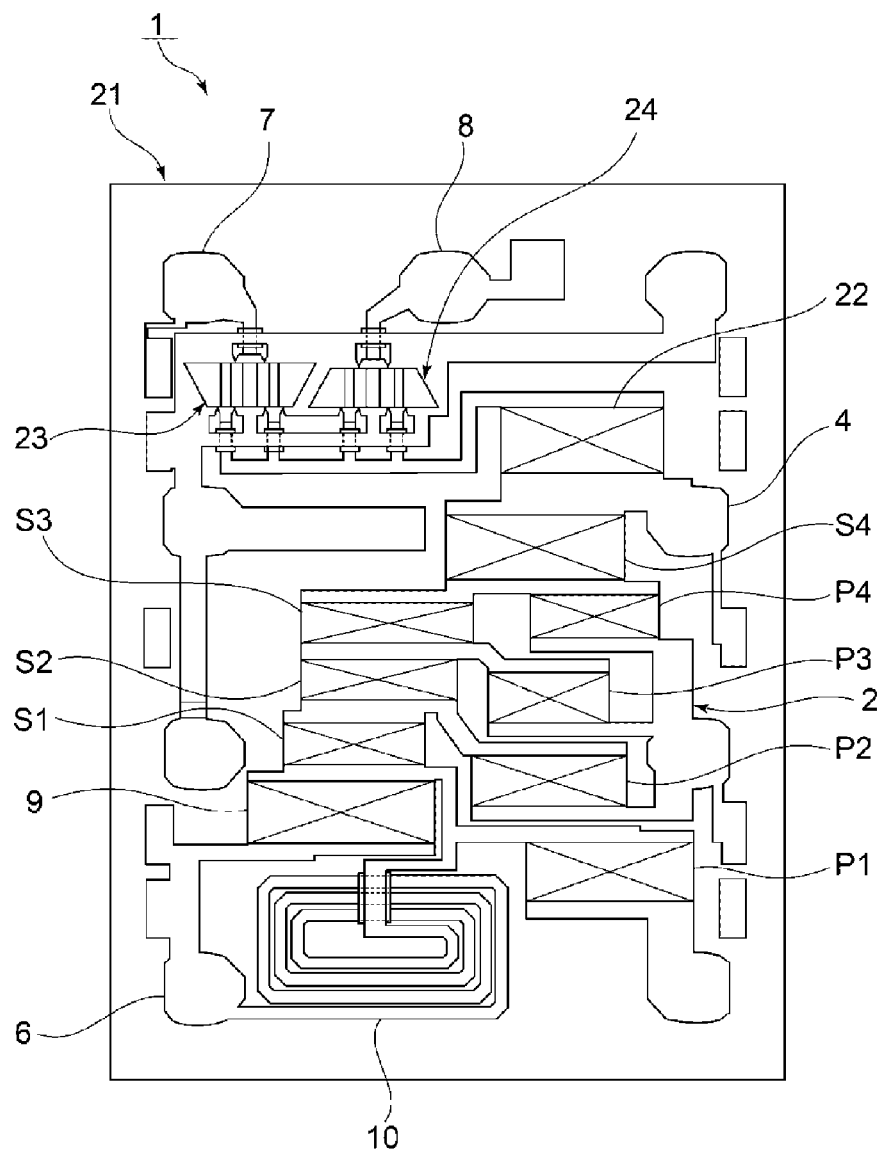
FIG. 2 is a plan view of a duplexer according to the first preferred embodiment of the present invention.

FIG. 2 is a plan view of the duplexer 1. In the duplexer 1, an electrode construction illustrated in FIG. 2 is provided on a piezoelectric substrate 21. This allows the duplexer 1 to be a single component.

The piezoelectric substrate 21 includes a substrate substantially composed of piezoelectric single crystal or piezoelectric ceramic or a substrate on which a film of piezoelectric single crystal is provided. In the present preferred embodiment, the piezoelectric substrate 21 preferably is substantially composed of piezoelectric single crystal such as $LiTiO_3$ or $LiNbO_3$, for example.

The transmission filter 2 and the reception filter 3 are provided on the piezoelectric substrate 21. In FIG. 2, the electrode construction that defines the transmission filter 2 and the reception filter 3 is illustrated schematically. In other words, the transmission filter 2 includes an electrode construction connected between the common connection terminal 4 and the transmission terminal 6.

Specifically, the one-port elastic wave resonator 9 and the series arm resonators S1 to S4 are defined by surface acoustic wave resonators, and IDTs and reflectors are disposed in areas that are illustrated with rectangular frames with "X" inside. In other words, the series arm resonators S1 to S4 also each include a one-port surface acoustic wave resonator in which reflectors are arranged on both sides of an IDT. Similarly, the parallel arm resonators P1 to P4 also each include one-port surface acoustic wave resonator.

The one-port elastic wave resonator 9 that defines and serves as the first series arm resonator is connected in parallel to the inductance 10 including a coiled conductor pattern. In other words, the inductance 10 is configured with a coiled conductor pattern that is preferably formed by winding a conductor into a coil shape.

On the other hand, an electrode construction that defines the reception filter 3 is provided between the common connection point 4 and the first and second balanced terminals 7 and 8. As illustrated in FIG. 2, the reception filter 3 includes a one-port surface acoustic wave resonator 22 that is connected to the common connection terminal 4. This one-port surface acoustic wave resonator 22 is connected to first and second longitudinally coupled resonator-type surface acoustic wave filter units 23 and 24. With regard to the first and second longitudinally coupled resonator-type surface acoustic wave filter units 23 and 24, portions where IDTs are provided and portions where reflectors are provided are also illustrated schematically.

In the present preferred embodiment, the reception filter 3 includes a balanced surface acoustic wave filter with a balanced-unbalanced transfer function. It should be understood that, in preferred embodiments of the present invention, the second bandpass filter of the duplexer is not limited to a longitudinally coupled resonator-type surface acoustic wave filter, and may alternatively be configured with a bandpass filter of a different type.

It is known that out-of-band attenuation may expand when an inductance is connected in parallel to a series arm resonator of ladder filter. However, a piezoelectric substrate has a relatively high dielectric constant. Thus, when an inductance is directly provided preferably by forming a conductor pattern on a substrate that has a relatively high dielectric constant such as the piezoelectric substrate, the Q value of the inductance becomes smaller due to parasitic capacitance of the inductance. In other words, the Q value becomes worse.

On the other hand, in the configuration where an inductance is connected in parallel to a series arm resonator as in the foregoing example, the insertion loss in the passband becomes worse when the Q value of the inductance is lower. Thus, it is desirable to increase the Q value of the inductance that is connected in parallel to the series arm resonator. However, forming a high-Q value inductance directly on a substrate that has a relatively higher dielectric constant is a difficult task. For example, it may be necessary to perform complicated steps such as providing a member that has a relatively small dielectric constant between the piezoelectric substrate and the inductance or using, not a planar configuration, but a three-dimensional configuration such as, for example, a multilayer structure for the inductance. Alternatively, it may be necessary to provide an external inductance portion or member on a mounting substrate on which the duplexer is mounted.

Whereas, in the present preferred embodiment, as illustrated in FIG. 2, when the inductance 10 including the coiled conductor pattern with a planar configuration is provided on the piezoelectric substrate, and the Q value becomes relatively small, namely, even when the Q value becomes worse, degradation of the insertion loss in the filter's passband is reduced. A detailed description is now provided below.

Figure 3:
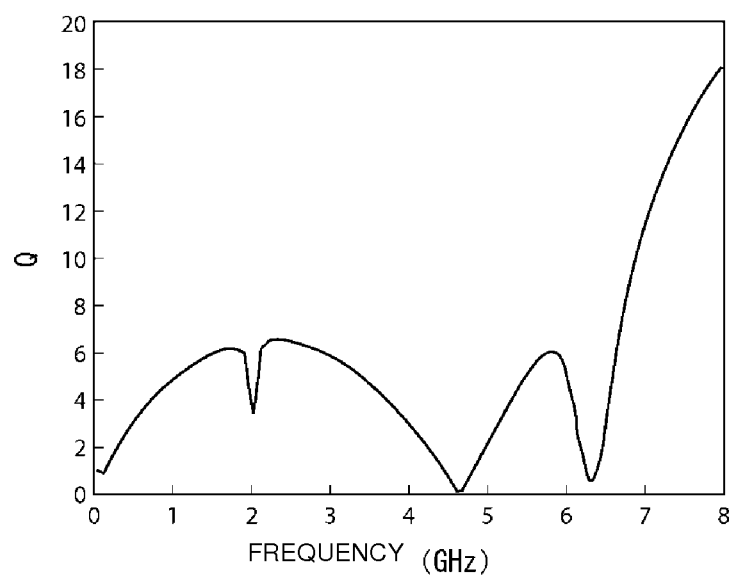
FIG. 3 is a diagram illustrating a relationship between frequency and Q value of an inductance connected in parallel to a first series arm resonator in the first preferred embodiment of the present invention.
Figure 4:
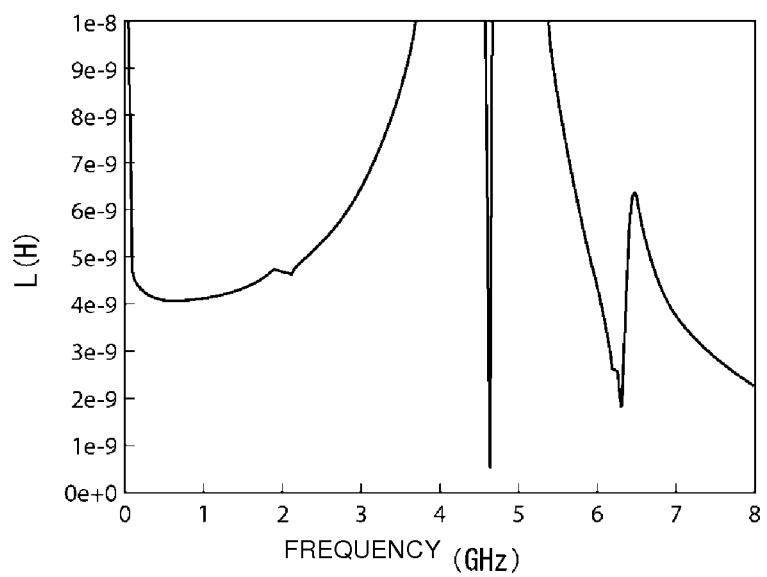
FIG. 4 is a diagram illustrating a relationship between frequency and inductance value L of the inductance connected in parallel to the first series arm resonator in the first preferred embodiment of the present invention.

FIG. 3 and FIG. 4 are diagrams illustrating a relationship between the Q value of the inductance 10 and the frequency and a relationship between the inductance value L and the frequency, respectively. As is evident from FIG. 3, it is apparent that the Q value of the inductance 10 is as small as about 6 near the passband of the foregoing transmission filter. Further, the inductance value is about $4 \times 10^{-9}$ to $5 \times 10^{-9}$ (H), for example.

Figure 5:
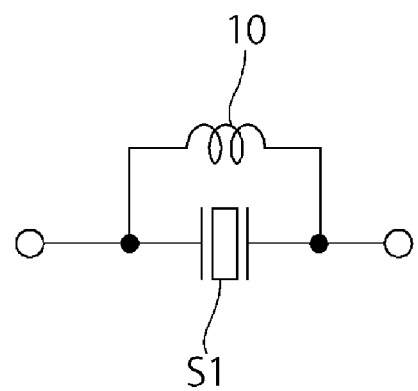
FIG. 5 is a circuit diagram illustrating a parallel circuit of the first series arm resonator and the inductance.
Figure 6:
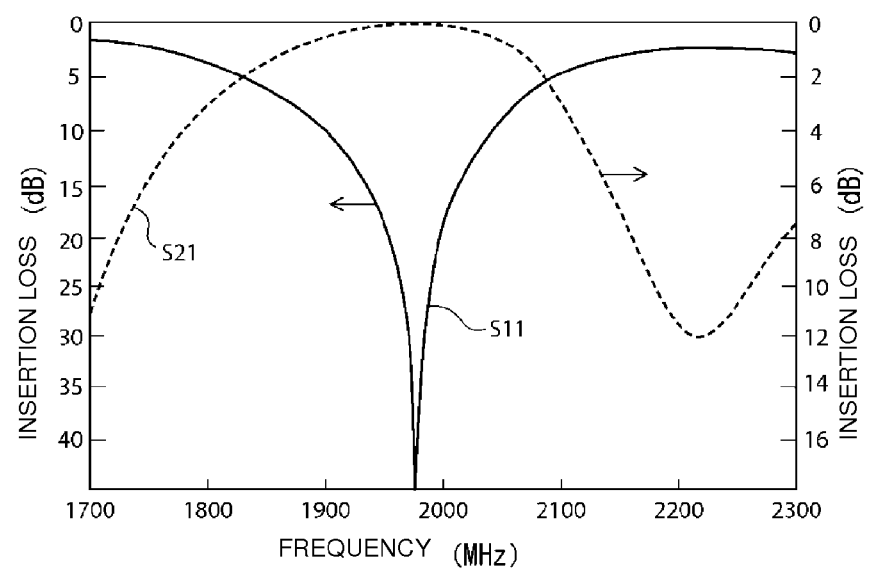
FIG. 6 is a diagram illustrating resonant characteristics of the circuit illustrated in FIG. 5.

On the other hand, FIG. 5 illustrates a parallel circuit of the series arm resonator S1 and the inductance 10. FIG. 6 illustrates resonant characteristics of this parallel circuit, in which a solid line illustrates the characteristic of S11 and a dashed line illustrates the characteristic of S21. Note that the characteristics illustrated in FIG. 6 are obtained when the resonant frequency fr1 of the one-port elastic wave resonator 9 is set at about 1977 MHz, for example.

Figure 7:
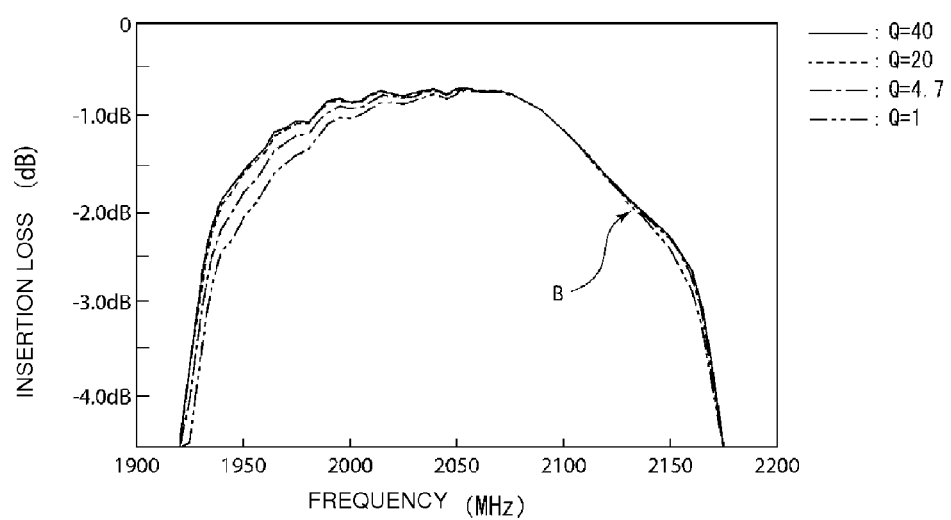
FIG. 7 is a diagram illustrating transmission characteristics in cases where the Q value of inductance is set to about 40, 20, 4.7, and 1 in a duplexer having the circuit configuration illustrated in FIG. 1.
Figure 8:
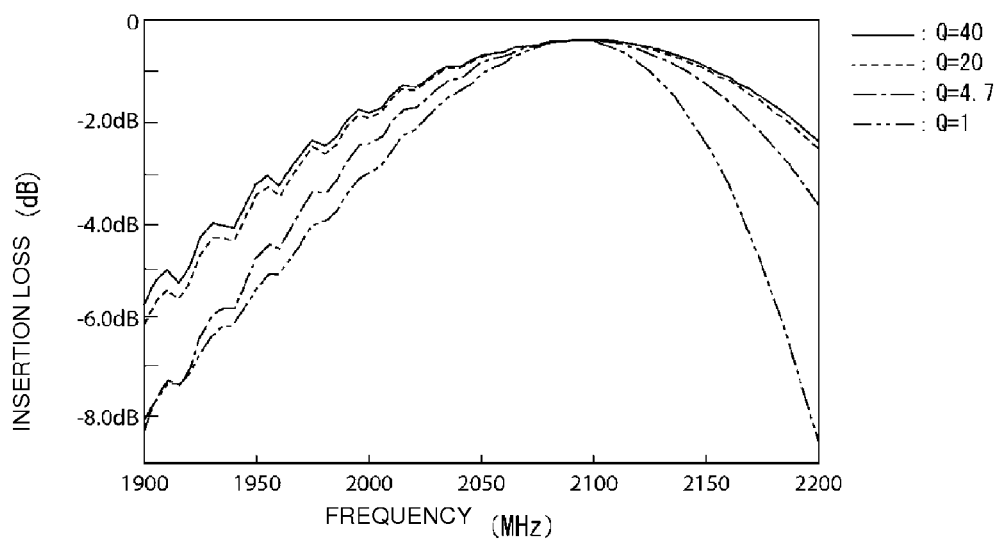
FIG. 8 is a diagram illustrating respective resonant characteristics in cases where the Q value of inductance is set to about 40, 20, 4.7, and 1 in a parallel circuit of the first series arm resonator and the inductance in the duplexer having the circuit configuration illustrated in FIG. 1.

Further, in the foregoing reception filter 3, four kinds of duplexers preferably are configured with varied Q values of the inductance 10, which are about 40, 20, 4.7, and 1, for example. FIG. 7 illustrates the transmission characteristics of these duplexers. Non-limiting examples of design parameters other than the Q value of the inductance 10 are as follows.

One-port elastic wave resonator 9: Wavelength=1.9616 μm, Number of electrode finger pairs=177 pairs, and Resonant frequency fr1=1975.5 MHz.

Series arm resonator S1: Wavelength=1.9754 μm, Number of electrode finger pairs=133 pairs, and Resonant frequency fr2=1965.1 MHz.

Series arm resonator S2: Wavelength=1.9820 μm, Number of electrode finger pairs=146 pairs, and Resonant frequency fr3=1959.2 MHz.

Series arm resonator S3: Wavelength=1.9967 μm, Number of electrode finger pairs=160 pairs, and Resonant frequency fr4=1945.1 MHz.

Series arm resonator S4: Wavelength=1.9754 μm, Number of electrode finger pairs=170 pairs, and Resonant frequency fr5=1965.1 MHz.

Note that the wavelength is determined by an electrode finger pitch of IDT.

With the configuration in which the Q value of the inductance 10 is about 40, it is difficult to form the inductance 10 on a piezoelectric substrate. Thus, it is preferable to form the inductance 10 on a non-piezoelectric substrate that has a lower dielectric constant, such as Si or the like. Thus, a larger space is required when the inductance 10 is formed on the non-piezoelectric substrate that is prepared separately from the piezoelectric substrate on which IDTs are formed.

In the foregoing preferred embodiment, the resonant frequency fr1 of the one-port elastic wave resonator 9 preferably is set higher than the center frequency f0. For comparison, a comparison example is prepared in which the resonant frequency fr1 of the one-port elastic wave resonator 9 is set at about 1928 MHz that is lower than the center frequency f0. The foregoing comparison example is configured similarly to the foregoing preferred embodiment except that the Q value of the inductance 10 is varied as described below and that the resonant frequency fr1 of the one-port elastic wave resonator 9 is set lower than the center frequency f0. The remaining configuration of the comparison example is similar to that of the foregoing preferred embodiment.

Figure 9:
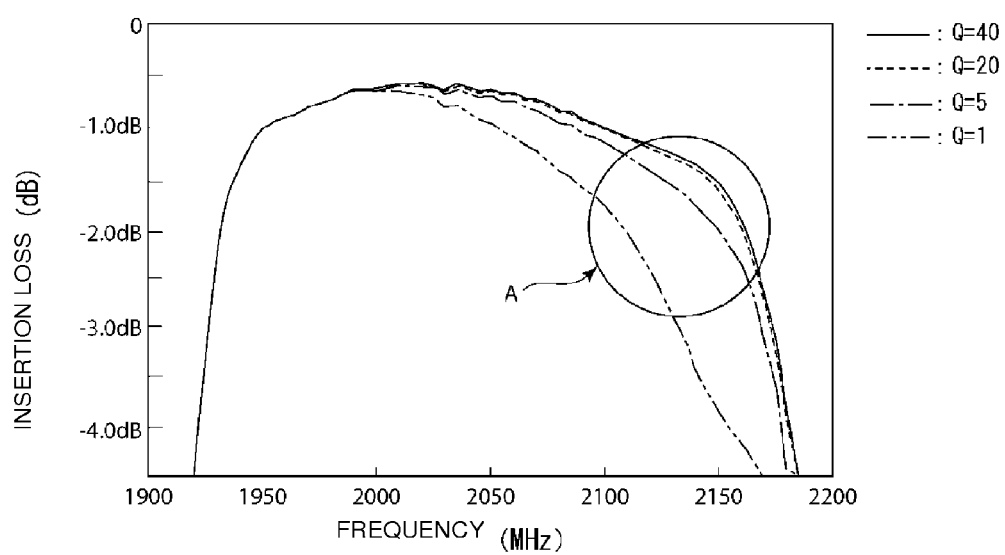
FIG. 9 is a diagram illustrating transmission characteristics in cases where the Q value of inductance is varied to different values in a duplexer of comparison example.
Figure 10:
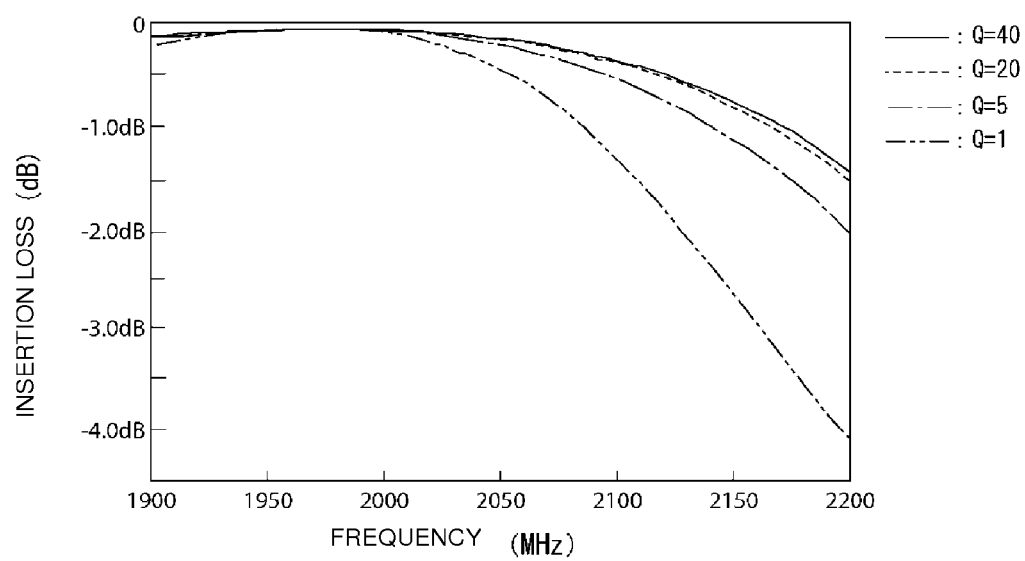
FIG. 10 is a diagram illustrating resonant characteristics of a parallel circuit of the first series arm resonator and the inductance in cases where the Q value of inductance is varied to different values in the duplexer of comparison example.

FIG. 9 illustrates the transmission characteristics of duplexers according to the comparison example. FIG. 10 illustrates resonant characteristics of parallel circuits of the inductance and the one-port elastic wave resonator 9 in transmission filters of the duplexers according to the comparison example.

In the comparison example, the Q value of the inductance 10 is varied to about 40, 20, 5, and 1. As is evident from comparison between FIGS. 7 and 8 and FIGS. 9 and 10, the foregoing preferred embodiment significantly reduces or prevents the insertion loss in the passband compared with the comparison example.

In other words, as is illustrated by an arrow A in FIG. 9, in the comparison example, the insertion loss in the transmission band, in particular, the insertion loss on the higher frequency side of the passband than the center frequency becomes worse as the Q value of inductance decreases from about 40 to about 20 to about 5 to about 1. Particularly, when the Q value of inductance is equal to or less than 20, the insertion loss in the passband is worse and degrades more on the higher frequency side than at the center frequency.

On the other hand, as illustrated by an arrow B in FIG. 7, it is apparent that, in the present preferred embodiment, the insertion loss in the passband does not degrade on the higher frequency side than the center frequency even when the Q value of the inductance 10 becomes very small. This is because a frequency range between resonant and anti-resonant frequencies in the one-port elastic wave resonator 9 is on the higher frequency side of the passband than the center frequency f0.

In other words, in the comparison example, the insertion loss becomes considerably worse in a frequency range on the higher frequency side of the passband than the center frequency f0, as illustrated in FIG. 9. The present preferred embodiment significantly reduces or prevents this insertion loss degradation highly effectively. Thus, the transmission filter 2 with less loss is obtained.

Preferably, it is desirable that the one-port elastic wave resonator 9 has a shorter wavelength than wavelengths of the series arm resonators S1 to S4. This makes it possible to set the resonant frequency fr1 easily on the higher frequency side than the center frequency f0. More preferably, it is desirable that the one-port elastic wave resonator 9 has a shortest wavelength among wavelengths that are determined by electrode finger pitches in the one-port elastic wave resonator 9 and the plural series arm resonators S1 to S4. This makes it possible to significantly reduce or prevent the insertion loss more effectively in the frequency range on the higher frequency side of the passband than the center frequency f0.

Further, it is desirable that the resonant frequency fr1 of the one-port elastic wave resonator 9 is higher than the resonant frequency of the series arm resonator that has a lowest resonant frequency among the one-port elastic wave resonator 9 and the plural series arm resonators S1 to S4. This makes it possible to significantly reduce or prevent the insertion loss degradation more effectively. More preferably, it is desirable that the resonant frequency fr1 of the one-port elastic wave resonator 9 is a highest among resonant frequencies of the one-port elastic wave resonator 9 and the plural series arm resonators S1 to S4.

In the present preferred embodiment, the plurality of the series arm resonators S1 to S4 preferably are provided. Alternatively, only one series arm resonator may be provided, for example.

Further, a plurality of the one-port elastic wave resonators 9 may be alternatively provided. In this case, the plural one-port elastic wave resonators 9 preferably are connected to each other in series.

Further, it is desirable to have a higher Q value in the inductance 10 to reduce the insertion loss in the passband. However, it is also desirable that the Q value of inductance is equal to or less than 20 to allow an effect of the present preferred embodiment, namely, the effect to lower the insertion loss in the passband even at a low Q value, to be obtained more effectively.

Degradation of the loss in portion of the passband on the higher frequency side than the center frequency becomes an issue when the Q value of the inductance 10 is equal to or less than about 20. However, such degradation of the insertion loss is effectively reduced or prevented by setting the resonant frequency fr1 of the one-port elastic wave resonator 9 on the higher frequency side than the center frequency f0, as in preferred embodiments of the present invention.

In the foregoing preferred embodiments, the elastic wave filter device according to a preferred embodiment of the present invention preferably is used for the transmission filter 2 of duplexer, for example. However, usage of the elastic wave filter devices according to preferred embodiments of the present invention is not limited to the duplexer, and may be suitably used for various ladder bandpass filters, for example.

Further, the elastic wave filter unit of the elastic wave filter device according to a preferred embodiment of the present invention is not limited to the foregoing ladder type filter, and may alternatively be a bandpass elastic wave filter unit with another circuit configuration. For example, as in a circuit diagram of the second preferred embodiment illustrated in FIG. 11, a one-port elastic wave resonator 9 preferably is connected in series to a longitudinally coupled resonator-type elastic wave filter unit 31. Here, one-port elastic wave resonators 32 and 33 are connected between ground potential and the longitudinally coupled resonator-type elastic wave filter unit 31 at an end portion opposite to the end portion connected to the one-port elastic wave resonator 9. FIG. 12A to FIG. 12D are schematic plan views illustrating electrode constructions at different heights of a multilayer substrate on which the elastic wave filter device according to the second preferred embodiment is provided.

Figure 12:
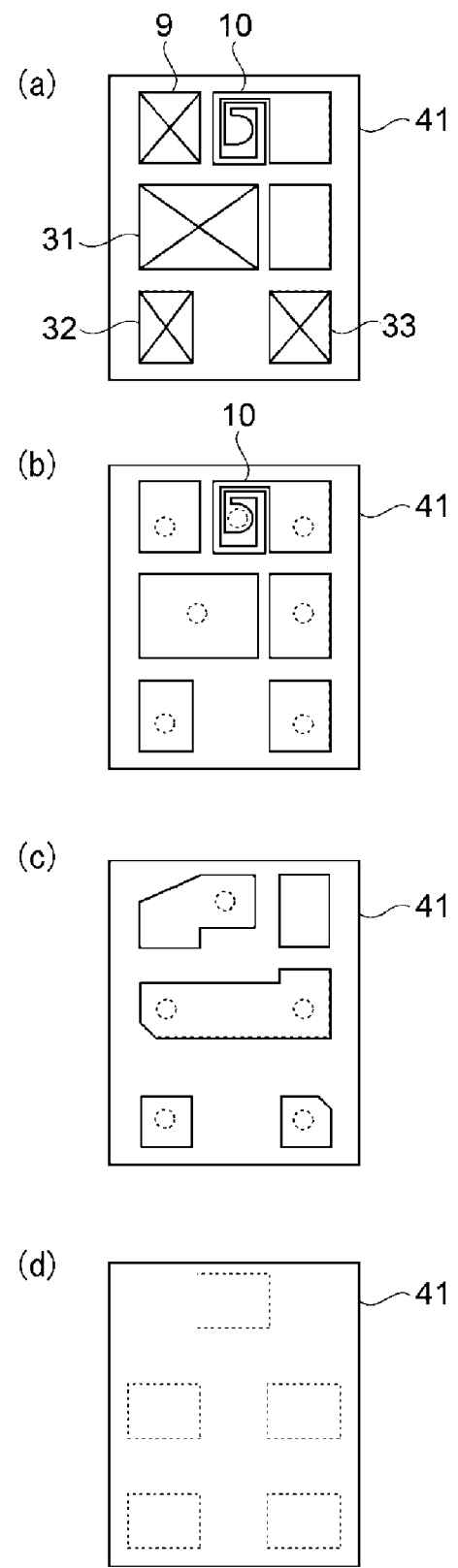
FIGS. 12A, 12B, 12C, and 12D are schematic plan views illustrating electrode constructions at different heights of a multilayer substrate on which the elastic wave filter device according to the second preferred embodiment of the present invention is provided.

FIG. 12A is a plan view of this multilayer substrate, FIGS. 12B and 12C are schematic plan views illustrating electrode constructions at intermediate heights, and FIG. 12D is a diagram illustrating an electrode construction at a bottom plane of the multilayer substrate in a schematic plan view.

Figure 11:
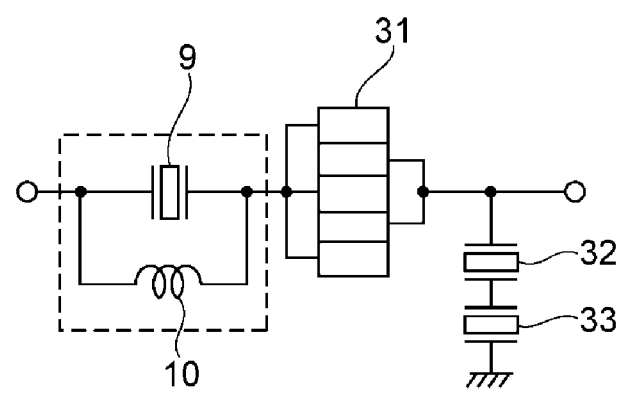
FIG. 11 is a circuit diagram of an elastic wave filter unit of an elastic wave filter device according to a second preferred embodiment of the present invention.

As illustrated in FIG. 12B, an inductance 10 is preferably defined a coiled conductor pattern. The inductance is connected in parallel to the one-port elastic wave resonator 9 as illustrated in FIG. 11. In the present preferred embodiment, the inductance 10 is preferably defined by the coiled conductor pattern in the multilayer substrate as described above.

Figure 13:
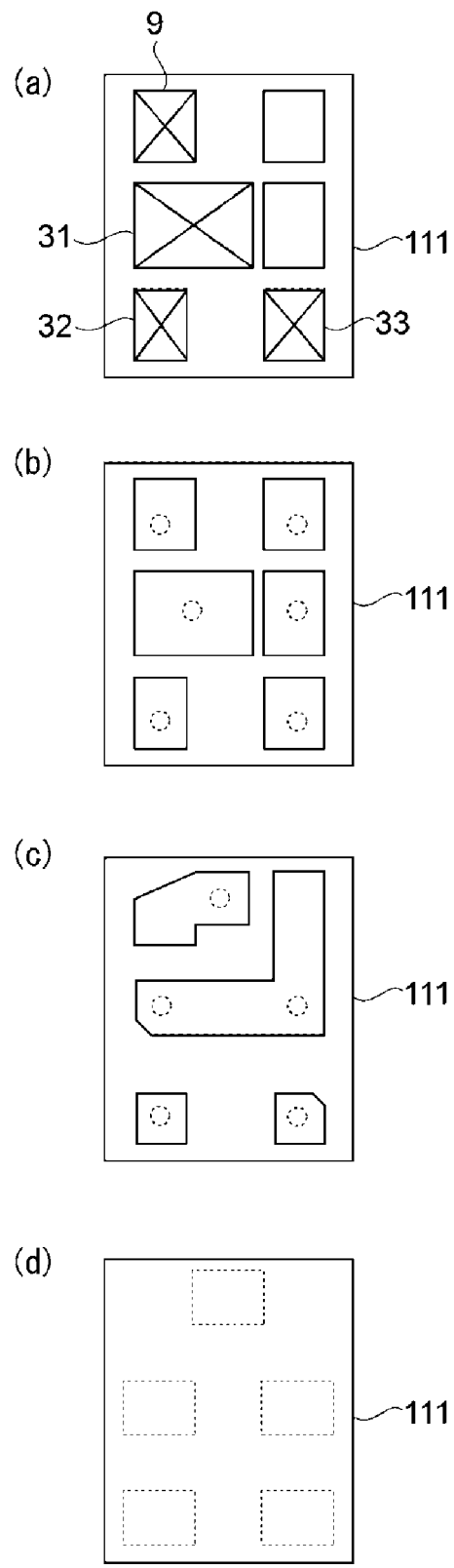
FIGS. 13A, 13B, 13C, and 13D are schematic plan views illustrating electrode constructions at different heights of an elastic wave filter device according to a second comparison example that serves as a comparison example for the second preferred embodiment of the present invention.

FIG. 13A to FIG. 13D are schematic plan views illustrating electrode constructions at different heights of an elastic wave filter device according to a second comparison example that serves as a comparison example for the second preferred embodiment. As illustrated in FIGS. 13A to 13D, the elastic wave filter device of the second comparison example is configured by using a multilayer substrate 111. As illustrated in FIG. 13B, the inductance 10 illustrated in FIG. 12B is not formed in the second comparison example.

Figure 14:
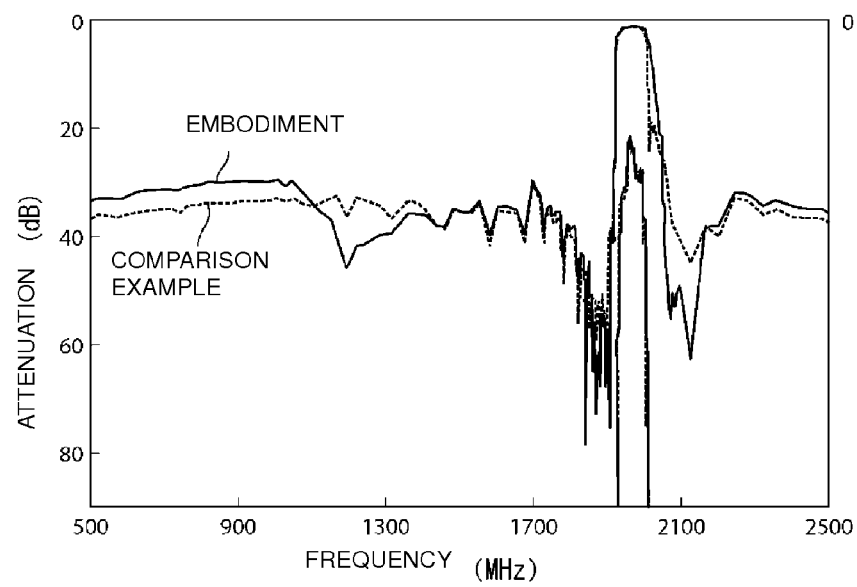
FIG. 14 is a diagram illustrating attenuation frequency characteristics of the elastic wave filter devices of the second preferred embodiment of the present invention and the second comparison example.

FIG. 14 is a diagram illustrating attenuation frequency characteristics of the elastic wave filter devices of the second preferred embodiment and the second comparison example.

As evident from FIG. 14, in the second preferred embodiment, the attenuation becomes larger near about 1.2 GHz that is a rejection band on a lower frequency side of the passband. It is considered that an attenuation pole is produced due to a resonance of a capacitive component of the one-port elastic wave resonator 9 and the inductance 10 provided on a multilayer substrate 41, and that this attenuation pole causes the attenuation to become larger.

Further, according to preferred embodiments of the present invention, the inductance 10 connected in parallel to the one-port elastic wave resonator 9 preferably has a lower Q value. Accordingly, the inductance 10 is easily provided by configuring a conductor pattern on the piezoelectric substrate that has a higher dielectric constant. Further, when the inductance 10 is defined by a conductor pattern, the length thereof preferably is made shorter. Further, when a coiled conductor pattern is used, the number of winding turns is reduced, making it possible to achieve a reduction in size.

Further, in the foregoing preferred embodiments, the coiled conductor pattern preferably is provided on the piezoelectric substrate 21. Alternatively, another conductor pattern such as a meander conductor pattern or the like preferably is used.

Further, in the foregoing preferred embodiments, the one-port elastic wave resonator 9, the plural series arm resonators S1 to S4, and the parallel arm resonators P1 to P4 are each preferably defined by an surface acoustic wave resonator, for example. Alternatively, these resonators may each be defined by another elastic wave resonator such as a boundary acoustic wave resonator or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
 a piezoelectric substrate;
 an elastic wave filter unit including at least one interdigital transducer provided on the piezoelectric substrate;
 an one-port elastic wave resonator including an interdigital transducer connected in series to the elastic wave filter unit; and
 an inductance connected in parallel to the one-port elastic wave resonator; wherein
 a resonant frequency fr1 of the one-port elastic wave resonator is on a higher frequency side of a passband of the elastic wave filter unit than a center frequency f0, where f0 is a center frequency of the passband of the elastic wave filter unit; and
 a wavelength determined by an electrode finger pitch of the interdigital transducer in the one-port elastic wave resonator is shorter than a shortest of wavelengths determined by electrode finger pitches of the at least one interdigital transducer in the elastic wave filter unit.

2. The elastic wave filter device according to claim 1, wherein a Q value of the inductance is equal to or less than 20.

3. The elastic wave filter device according to claim 1, wherein the elastic wave filter unit is a filter unit that includes the piezoelectric substrate and a longitudinally coupled resonator-type elastic wave filter disposed on the piezoelectric substrate.

4. The elastic wave filter device according to claim 1, wherein the inductance is disposed on the piezoelectric substrate.

5. The elastic wave filter device according claim 1, wherein
 the elastic wave filter unit is a ladder elastic wave filter unit including the piezoelectric substrate, a series arm disposed on the piezoelectric substrate, a parallel arm connected between the series arm and ground potential, a plurality of series arm resonators disposed on the series arm, and a parallel arm resonator disposed on the parallel arm;
 the plurality of series arm resonators and the parallel arm resonator each include an elastic wave resonator including an interdigital transducer of the at least one interdigital transducer;
 no inductance is connected in parallel to the plurality of series arm resonators; and
 the resonant frequency fr1 of the one-port elastic wave resonator is on a higher frequency side than a resonant frequency fr2, where fr2 is a highest one of resonant frequencies of the series arm resonators of the ladder elastic wave filter unit.

6. The elastic wave filter device according to claim 5, wherein the wavelength determined by the electrode finger pitch of the interdigital transducer in the one-port elastic wave resonator is shorter than a wavelength determined by an electrode finger pitch of one of the plurality of series arm resonators.

7. The elastic wave filter device according to claim 5, wherein the wavelength of the one-port elastic wave resonator is shorter than a shortest one of wavelengths determined by electrode finger pitches in the plurality of series arm resonators.

8. The elastic wave filter device according to claim 5, wherein the resonant frequency fr1 of the one-port elastic wave resonator is higher than a resonant frequency of the series arm resonator that has a lowest resonant frequency among the plurality of series arm resonators.

9. The elastic wave filter device according to claim 5, wherein the resonant frequency fr1 of the one-port elastic wave resonator is higher than resonant frequencies of the plurality of series arm resonators.

10. A duplexer comprising:
 a first bandpass filter including the elastic wave filter device according to claim 1; and
 a second bandpass filter that has a different passband from the first bandpass filter.

11. The duplexer according to claim 10, wherein the inductance is disposed on the piezoelectric substrate.

12. The duplexer according to claim 10, wherein
 the elastic wave filter unit is a ladder elastic wave filter unit including the piezoelectric substrate, a series arm disposed on the piezoelectric substrate, a parallel arm connected between the series arm and ground potential, a plurality of series arm resonators disposed on the series arm, and a parallel arm resonator disposed on the parallel arm;
 the plurality of series arm resonators and the parallel arm resonator each include an elastic wave resonator including an interdigital transducer of the at least one interdigital transducer;
 no inductance is connected in parallel to the plurality of series arm resonators; and the resonant frequency fr1 of the one-port elastic wave resonator is on a higher frequency side than a resonant frequency fr2, where fr2 is a highest one of resonant frequencies of the series arm resonators of the ladder elastic wave filter unit.

13. The duplexer according to claim 12, wherein the wavelength determined by the electrode finger pitch of the interdigital transducer in the one-port elastic wave resonator is shorter than a wavelength determined by an electrode finger pitch of one of the plurality of series arm resonators.

14. The duplexer according to claim 12, wherein the wavelength of the one-port elastic wave resonator is shorter than a shortest one of wavelengths determined by electrode finger pitches in the plurality of series arm resonators.

15. The duplexer according to claim 12, wherein the resonant frequency fr1 of the one-port elastic wave resonator is higher than a resonant frequency of the series arm resonator that has a lowest resonant frequency among the plurality of series arm resonators.

16. The duplexer according to claim 12, wherein the resonant frequency fr1 of the one-port elastic wave resonator is higher than resonant frequencies of the plurality of series arm resonators.

* * * * *